United States Patent
Kozak et al.

(10) Patent No.: US 6,414,850 B1
(45) Date of Patent: Jul. 2, 2002

(54) METHOD AND APPARATUS FOR DECOUPLING BALL GRID ARRAY DEVICES

(75) Inventors: Frederic M. Kozak; Real Gislain Pomerleau, both of Raleigh, NC (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/481,139

(22) Filed: Jan. 11, 2000

(51) Int. Cl.[7] .................................................. H05K 1/14
(52) U.S. Cl. ...................... 361/793; 361/792; 361/782; 361/783; 257/723; 257/724; 257/798; 174/260; 174/262
(58) Field of Search ............................... 361/793, 792, 361/766, 794, 808, 502, 717, 720, 734, 736, 748, 761, 764, 760, 782–783; 174/260, 262; 257/723–724, 700–703, 798

(56) References Cited

U.S. PATENT DOCUMENTS

| | | | |
|---|---|---|---|
| 4,636,918 A | * | 1/1987 | Jodoin .......................... 361/405 |
| 4,682,207 A | * | 7/1987 | Akasaki et al. ................ 357/74 |
| 4,811,082 A | * | 3/1989 | Jacobs et al. .................. 357/80 |
| 5,010,641 A | * | 4/1991 | Sisler ............................ 29/830 |
| 5,255,431 A | | 10/1993 | Burdick ........................ 29/840 |
| 5,774,326 A | * | 6/1998 | McConnelee et al. ...... 361/313 |
| 5,926,375 A | * | 7/1999 | Watanabe et al. ........... 361/760 |
| 5,953,214 A | | 9/1999 | Dranchak et al. ........... 361/767 |
| 5,982,635 A | * | 11/1999 | Menzies et al. ............. 361/790 |
| 6,004,657 A | | 12/1999 | Moriyasu et al. ........... 428/210 |
| 6,021,050 A | | 2/2000 | Ehman et al. ............... 361/793 |
| 6,031,728 A | | 2/2000 | Bedos et al. ................. 361/767 |
| 6,169,663 B1 | | 1/2001 | Garcia ......................... 361/760 |

OTHER PUBLICATIONS

*MicroStar BGA Packaging Reference Guide*; Texas Instruments; Literature No. SSYZ015A; Second Edition—Sep. 1999; 7 pages.
*Presenting the ACC Three Musketeers*; web page; ACHEM Technology, USA; last modified May 11, 1999; 1 page.
*T–preg Dielectric—The Essential Component to all T–lam System PCBs*; Thermagon, Inc.; 2 pages.

* cited by examiner

*Primary Examiner*—David Martin
*Assistant Examiner*—Hung Bui
(74) *Attorney, Agent, or Firm*—Skjerven Morrill LLP; Samuel G. Campbell, III

(57) ABSTRACT

A small circuit board, preferably having or providing capacitance is mounted on the surface of a main circuit board opposite the surface where a BGA or other integrated circuit is mounted, and within the footprint defined the integrated circuit package. Preferably the small circuit board is formed from multiple interleaved conductive and dielectric layers to provide inherent capacitance in the circuit board itself. Capacitance provided by the small circuit board can be configured by selecting the number and/or size and/or placement of the conductive layers. Discrete devices can be mounted on the small circuit board if desired.

21 Claims, 3 Drawing Sheets

METHOD AND APPARATUS FOR DECOUPLING BALL GRID ARRAY DEVICES

The present invention is directed to a method and apparatus for decoupling pins of a high density integrated circuit mounted on a circuit board and in particular to providing a method and system for providing decoupling capacitance with respect to power and/or ground pins of a ball grid array integrated circuit.

BACKGROUND INFORMATION

A number of fashions of mounting an integrated circuit to a printed circuit board have been used or proposed. One currently-used mounting procedure and device involves ball grid array (BGA) packaged integrated circuits (ICs) having a range of configurations such as packages with about 80 pins having a square footprint of 6 mm by 6 mm to packages having 256 or more pins, having a square footprint of about 15 mm by 15 mm or more. BGA's are often used with especially high pin count and/or high density integrated circuits. High pin count integrated circuit packages can contain, for example, 256 pins, 672 pins or more. The pins are relatively high density, in many embodiments such as providing as many as 256 pins in a relatively small area such as packages with a square footprint about 15 mm on each side or less.

Although ball grid array devices have been useful in electronic device fabrication, there are also certain disadvantageous aspects in current implementations of BGA devices. Typically, IC packages provide for at least some pins dedicated to supplying power, such as power pins and ground pins. In general, it is desired to provide capacitance for the power and ground pins, e.g. for decoupling purposes. Previous approaches, however, have generally used discrete decoupling capacitors which are placed a relatively large distance (such as more than about 2 mm, often more than about 5 mm), from the ICs' power and/or ground pins. This relatively-large spacing has been a function of many factors, including the fact that the discrete decoupling capacitors have previously been positioned outside the "footprint area" of the IC package and the fact that the power and ground pins generally are positioned in the inner rows of the package (i.e. closest to the die pad). Such relatively large spacing of the decoupling capacitors has several undesirable consequences. The relatively long copper tracks from the power and ground pins to the discrete capacitors creates an amount of wiring inductance. An increase in inductance can lower the resonant frequency of the decoupling capacitor, reducing the effectiveness of the decoupling capacitor. In some applications, reduction of the effectiveness of a decoupling capacitor can be detrimental to the operation of the device which the capacitor is attached to. In general, it is useful to facilitate reduction in power and ground supply noise by providing a relatively low-impedance path to the power and ground systems over a large frequency range and prior designs have made it difficult to provide such a low-impedance path. Accordingly, it would be useful to provide a method and apparatus for decoupling of power or other pins of an integrated circuit while avoiding a relatively large spacing from the pins to decoupling capacitors or other devices.

In addition to possible degrading of device performance, previous approaches of providing discrete decoupling capacitors have also been relatively expensive to implement. The process of placing and routing individual discrete capacitors can be time consuming and relatively expensive. Because of the need for positioning individual capacitors, there is little opportunity for cost savings arising from a standardization of pin placement, e.g. across multiple PCBs or across multiple IC packages on a single PCB. Accordingly, it would be useful to provide a decoupling for power or other pins of an integrated circuit while reducing board fabrication costs, e.g. compared to fabrication costs for providing discrete decoupling capacitors.

In typical prior BGA devices, the region of the PCB opposite the area of mounting of the BGA package (i.e. the portion of the circuit board which corresponds to the footprint of the BGA package, but is on the surface opposite the surface where the BGA package is mounted) was substantially unavailable for mounting other components. Accordingly, in many previous approaches, for a given size (surface area) of a BGA device, an area of twice that size (surface area) was unavailable for positioning discrete devices or circuitry. Accordingly, it would be useful to provide a method and apparatus which reduces the amount of surface area of the PCB which is rendered unavailable for mounting discrete components, circuitry and the like when a BGA device is coupled, i.e. which makes it feasible to position surface-mount or other discrete devices and/or circuitry in a region of the circuit board on the surface opposite to the surface a BGA is mounted, but within the footprint of the BGA package.

SUMMARY OF THE INVENTION

According to one aspect of the present invention, a small printed circuit board (PCB) or decoupling board is mounted on a surface of a PCB at least partially covering or intersecting the area of the footprint defined by the BGA package, but on the surface opposite to the surface where the BGA package is mounted. The small circuit board may be mounted to the main PCB in a number of fashions but, preferably, includes solder ball mounting. Preferably the small circuit board itself provides an amount of capacitance such as being or containing a layered capacitor, such as a multilayer capacitor structure. In one embodiment, multiple conductive layers are interleaved with multiple high-dielectric layers. If desired, two or more sets of conductive layers are coupled together, e.g. to form a set of power layers and a set of ground layers for respectively decoupling power and ground pins of the BGA device. Preferably the small circuit board can contain its own printed or other circuitry and/or may contain discrete components, e.g. surface mounted on the exterior surface of the small circuit board. By positioning the small circuit board within the footprint defined by the BGA package, the distance of copper or other conductive leads from the BGA power and ground (or other) pins to the decoupling capacitor can be relatively small such as about equal to the thickness of the main circuit board or less than the thickness of the main circuit board plus the thickness of the small circuit board and mounting components. It is believed that mounting of the small circuit board (preferably using solder ball mounting) is less time consuming and/or less expensive than positioning and mounting of discrete decoupling capacitors. Positioning discrete components or circuitry on or in the small circuit board effectively utilizes the space which is within the footprint defined by the BGA device but on or near the surface opposite where the BGA device is mounted.

DETAILED DESCRIPTION OF THE PREFERRED EMBODIMENTS

The present invention includes a recognition of the existence, nature and/or source of certain problems found in previous approaches, including as described herein.

Figure 2:
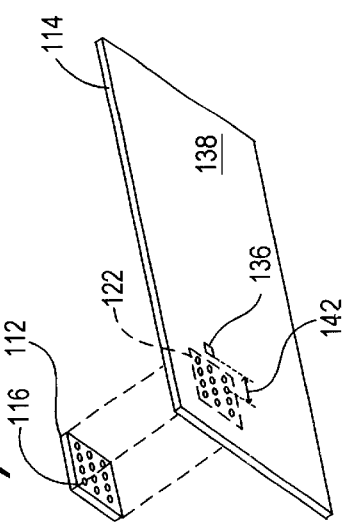
FIG. 2 is a bottom perspective view of mounting a BGA and discrete decoupler according to previous approaches.
Figure 1:
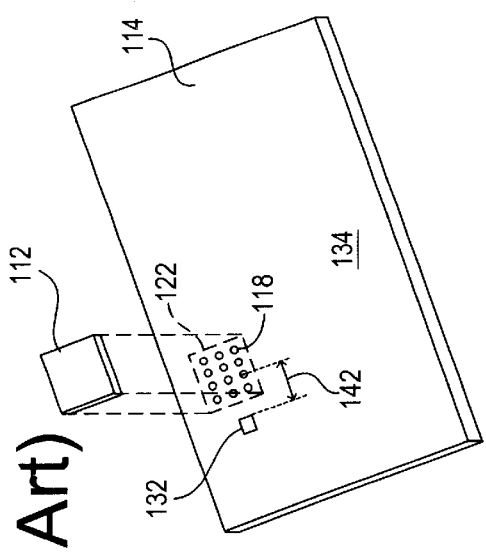
FIG. 1 is a top perspective view of mounting a BGA and discrete decoupler according to previous approaches.

Before describing aspects of the present invention, certain features of previous approaches will be described. As shown in FIG. 1, an integrated circuit package 112 can be mounted to a main circuit board 114 using a ball grid array (BGA) approach. A ball grid array integrated circuit package 112 includes a plurality of solder balls 116 on its lower surface as shown in FIG. 2. The solder balls 116 are configured for coupling using pads, lands, through-holes, vias and/or other receptors 118 formed in a footprint area 122 of the circuit board 114. Heat is applied for achieving solder reflow for attaching the BGA device 112 to the circuit board 114 as will be understood by those of skill in the art. As will be understood by those of skill in the art, a given printed circuit board 114 may contain numerous different integrated circuits mounted thereon and may have integrated circuits mounted on both surfaces of the PCB.

The BGA device 112 includes a plurality of pin positions for making various electrical connections. Among the pins on a typical BGA are pins used for power supply such as power pins, ground pins and the like. Commonly, power pins are positioned in or near the innermost rows of pins 126 (FIG. 3) so as to be relatively near the integrated circuit die 128 (e.g. for maintaining low self-inductance and low mutual inductance on the power and ground pins). Typically, connections to or from circuitry on the main PCB 114 to the power or ground pins 126 are provided via one or more discrete, typically surface-mounted, capacitors 132 mounted on the primary surface 134 of the PCB 114 and/or capacitors 136 mounted on the secondary surface 138 of the PCB 114. In either case, the discrete capacitors 132, 136 are typically positioned outside the footprint 122 defined by the BGA device 112. Discrete capacitors 132 positioned on the primary surface 134 are outside the footprint 122 because the footprint 122 is occupied by the BGA package 112. Capacitors 136 on the secondary surface 138 (i.e. the surface opposite the surface where the BGA device 112 is mounted) are mounted outside the footprint 112 because the footprint 112 is occupied by through-holes, vias or other devices for receiving the solder balls.

Figure 3:
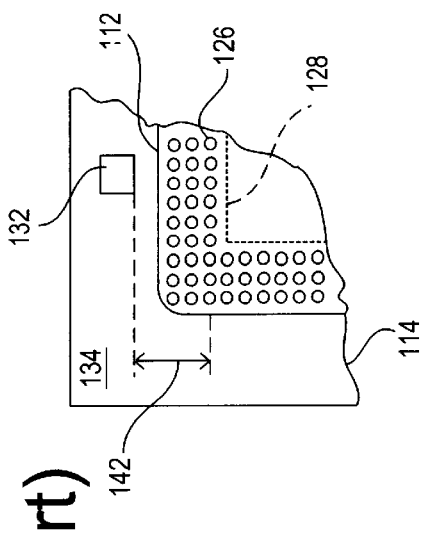
FIG. 3 is a top plan view of a portion of a circuit board showing a spatial relationship between a BGA mounting area and a discrete decoupling capacitor according to previous approaches.

For the configurations depicted in FIGS. 1–3, the discrete capacitors 132, 136 must be provided with copper or other conductive leads from the position of the discrete capacitors 132, 136 to the position of the ground or power pins 126. Accordingly, in previous approaches, such leads to the discrete capacitors had relatively great lengths 142 such as greater than about 2 mm, more typically greater than about 5 mm and even more typically greater than about 7 mm. Such relatively long leads are associated with certain undesirable consequences. Such relatively long leads provide an amount of wiring inductance. Increase in inductance lowers the resonant frequency of the decoupling capacitor circuit. The lowered resonance frequency reduces the effectiveness of the capacitor. In some cases, the lowering of the resonance frequency is detrimental to the operation of the integrated circuit 112 to which the capacitor is attached. Relatively lengthy paths 142 are substantially incompatible with providing the type of low-impedance path, over a large frequency range, of the type desirable for providing reduced power and ground supply noise.

Figure 4:
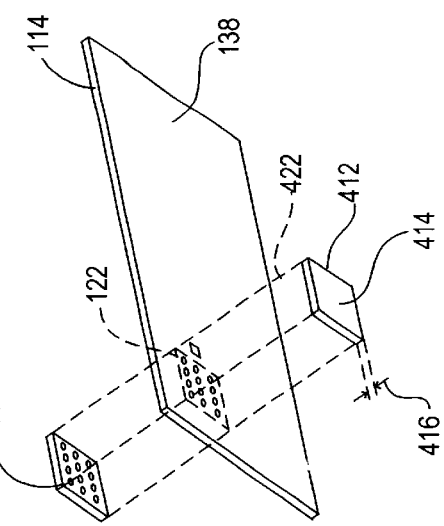
FIG. 4 is a bottom perspective view of a BGA decoupler device according to an embodiment of the present invention.

As depicted in FIG. 4, according to one embodiment of the present invention, a (preferably small) circuit board 412 capable of providing or accommodating an amount of decoupling capacitance, is mounted on the secondary surface 138 of the circuit board 114 (i.e. the surface opposite the surface where the BGA device 112 is mounted) so as to at least partially cover or overlap (and, in one embodiment to substantially fully cover) the footprint 122. Although it is possible to mount discrete capacitors or other components on the exterior surface, 414 of the small circuit board 412, preferably, the small circuit board 412 provides or includes capacitance in the circuit board material itself 414. In one embodiment, the circuit board 412 is made up of, or includes, a multilayer capacitor. In one embodiment, the small circuit board 412 is formed by providing at least one dielectric and one conductive layer, and preferably provides multiple interleaved conductive and dielectric layers. The amount of capacitance can be controlled by increasing or decreasing the number and/or size of layers, type of thickness of dielectric and the like. Preferably the conductive layers are relatively closely spaced such as by using relatively thin dielectric layers. Preferably the dielectric layers have a relatively high dielectric constant such as a dielectric constant of at least about 4, preferably at least about 4.5, such that the structure can achieve relatively high capacitance while remaining relatively thin such as having a thickness 416 of less than about 4 mils (about 0.1 mm, preferably less than about 2 mils (about 0.05 mm). A number of materials can be used for dielectric. One example is the dielectric or circuit board material sold under the trade designation FR4 and available from numerous sources including Hadco of Salem, N.H.

In one embodiment, two or more separate capacitors are formed or included in the small circuit board such as providing a first set of conductive layers 612a, b, c interleaved with respect to a second set of conductive layers 614a, 614b, 614c, all separated from one another by dielectric layers 618a through 618e. In one embodiment, the conductive layers 612a, b, c, 614, a, b, c are made of copper or a copper alloy although other conductive materials can be used including aluminum, gold and the like. Preferably the materials selected for the small circuit board 412 are selected to also provide an amount of heat control such as by acting as a heat sink or otherwise providing substantial thermal mass. Preferably some or all materials in the small circuit board 412 have a relatively high heat conductivity and/or heat capacity. For this reason, it is particularly useful to provide copper as some or all of the conductive layers since copper provides a relatively high thermal conductivity at relatively low cost compared to other high thermal conductivity materials.

Figure 6:
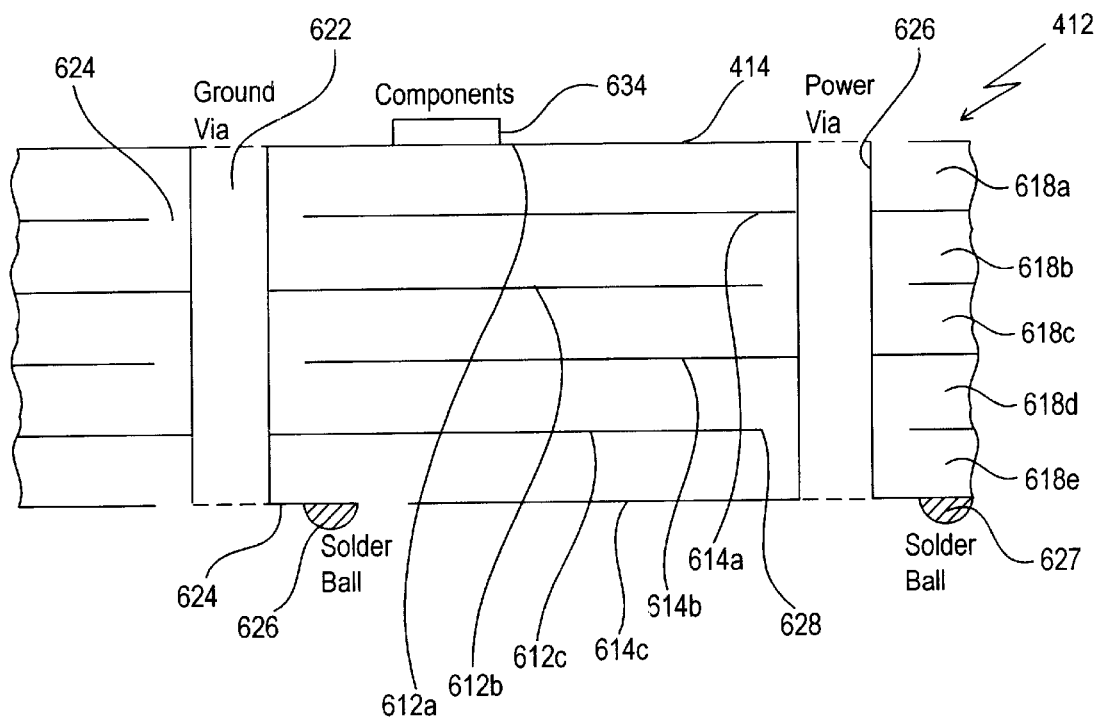
FIG. 6 is a partial cross-sectional view through a decoupler with vias according to an embodiment of the present invention.

In the embodiment depicted in FIG. 6, a first via (termed a "ground via") is filled with a conductive material (or provided with a conductive wall coating) e.g. copper 622 for providing a conductive pathway among the various conductive layers in the first set 612a, b, c (with the second set of conductive layers 614a, b, c being spaced 624 from the ground via 622). Similarly, a second "power" via is filled with (or has a wall coating of) copper or other conductive material 626 for coupling the second set of conductive layers 614a, b, c (with the first set 612a, b, c, being spaced 628 from the power via 626).

In the embodiment depicted in FIG. 6, the interior surface of the small circuit board 412 (i.e. the surface 624 which will be adjacent the secondary surface 138 of the circuit board 114) is provided with a plurality of solder balls. In the depicted embodiment, at least a first solder ball 626 is in electrical communication with the ground via 622 and a second solder ball 627 is in electrical communication with the power via 626.

In the embodiment depicted in FIG. 6, the exterior surface 414 of the small circuit board 412 (i.e. the surface which is exposed when the small circuit board 412 is mounted) can be used for mounting various types of electronic components such as surface-mount components 634. Numerous types of components 634 can be mounted on the exterior surface 414 including, e.g., discrete capacitors (e.g. for bulk decoupling), resistors, connectors, power converters, or other integrated circuits.

Figure 7A:
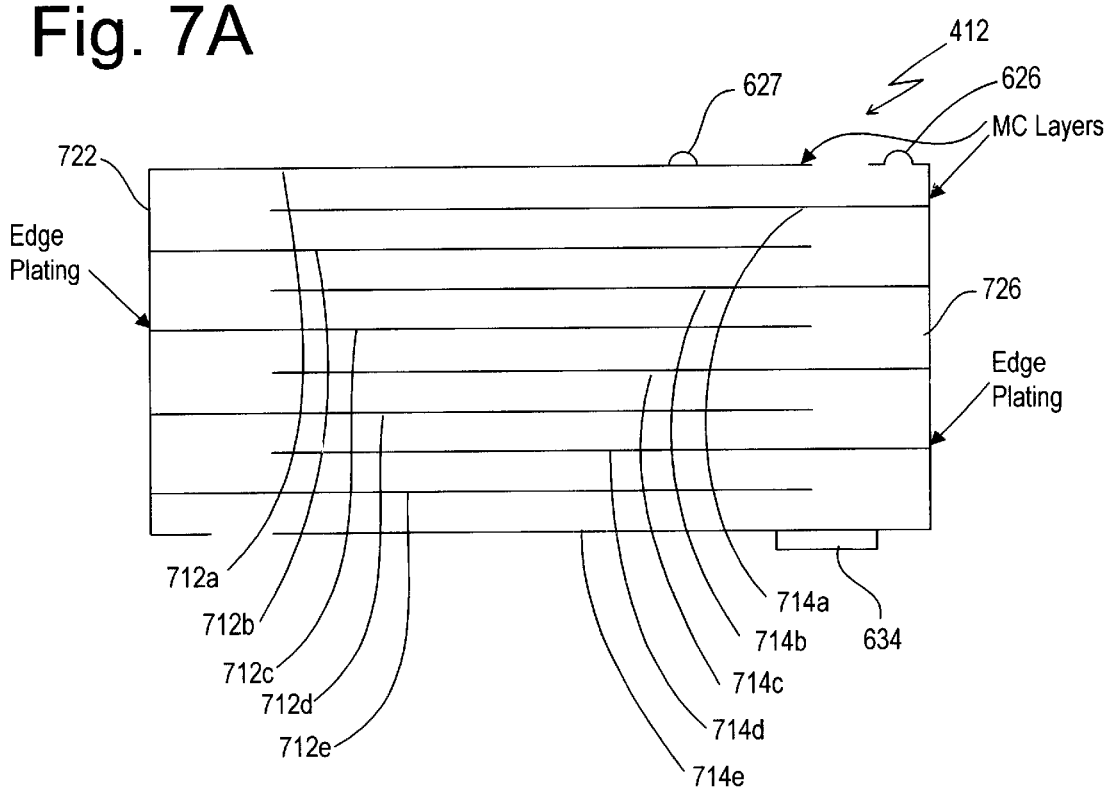
FIG. 7A is a cross-sectional view though a decoupler device with edge plating according to an embodiment of the present invention.

FIG. 7A is a depiction of a small circuit board 412 similar to that depicted in FIG. 6 except that connection between a first set of conductive layers 712a–e is provided by a first edge plating layer 722 and connection between a second set of conductive layer 714a through 714e is provided by a second edge plating 726.

Figure 5:
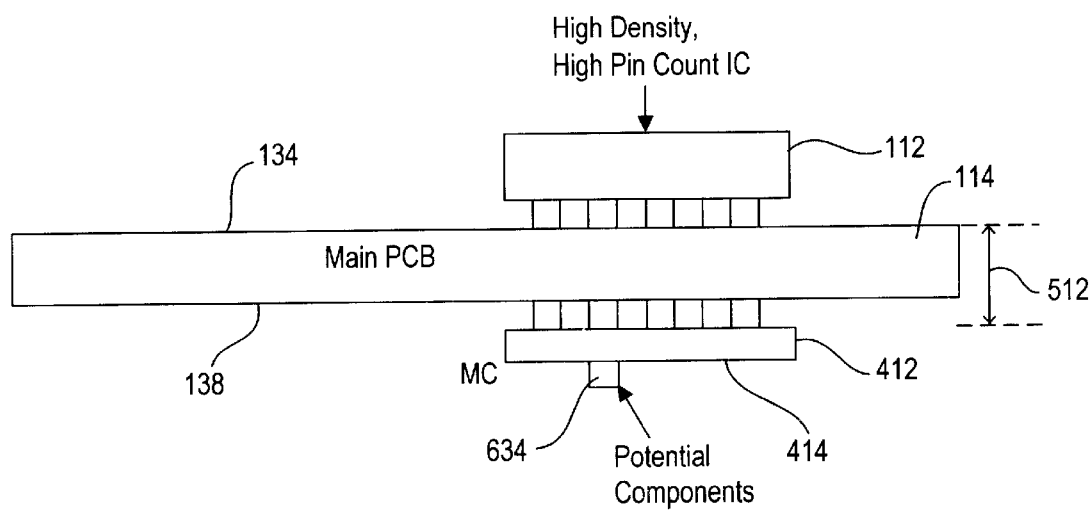
FIG. 5 is a cross-sectional view through a BGA, circuit board and decoupler according to an embodiment of the present invention.

In light of the above discussion, a number of advantages to the present invention can be seen. The present invention provides for the ability to provide a relatively short path length 512 (FIG. 5) from the multilayer capacitor 414 to selected power ground or other pins of an integrated circuit 112 (compared to previous path links 142) such as less than about 5 mm, preferably less than about 2 mm. The present invention can provide lower wiring inductance, avoiding adversely affecting effectiveness of the decoupling capacitors and facilitating a reduction of power or ground supply noise (e.g. by maintaining very low-impedance paths between the power and ground system over a large frequency range). The present invention effectively increases the amount of surface area of a printed circuit board which can be used for mounting discrete components, providing circuitry and the like, by permitting positioning of circuitry or discrete components and the like within the footprint area 422 defined by an integrated circuit 112 (but on the opposite surface 138). The present invention can eliminate or reduce time consumption and/or expense associated with (typically substantially manual) processes for placing and/or routing individual decoupling capacitors, as was typical in previous approaches. In one embodiment, single configuration of a decoupling board 412 can be used on a plurality of different positions on a given circuit board (or on a plurality of different circuit boards) e.g. by standardizing power and ground pin locations for different package types. It is believed the ability to replicate the small boards 412 over large PCB panels will assist in reducing manufacturing costs. Preferably the decoupling board 412 can be used as an approach for decoupling a wide variety (and preferably substantially all types) of BGA packages. The present invention can assist in controlling device temperature, e.g. by providing substantial thermal conductivity, thermal capacity and/or otherwise acting as a heat sink or radiator. The present invention can provide for termination of, e.g. high speed signals. The present invention reduces or eliminates the need for PCB traces to interconnect decoupling capacitors to a high pin-count high-density IC. In at least some embodiments, capacitor performance is improved, compared to previous discrete capacitor designs, at least by decreasing parasitics inherent to the physical design. The decoupling board 412 can utilize surface mount technology for reduced parasitics and improved space utilization.

Figure 7B:
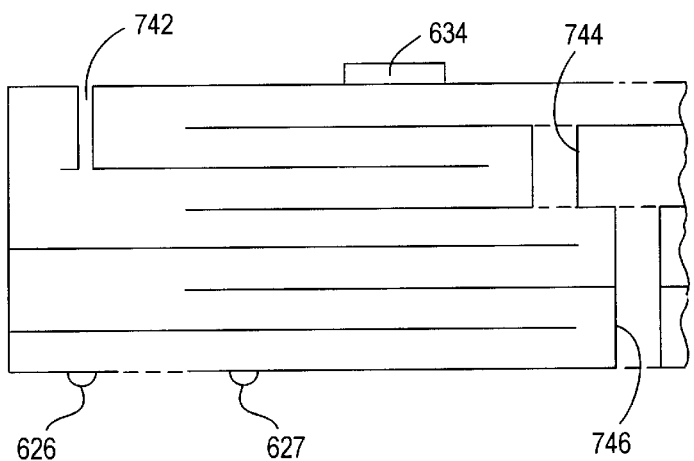
FIG. 7B is a partial cross-sectional view though a decoupler device with edge plating, micro vias, buried vias and blind vias, according to an embodiment of the present invention.

A number of variations and modifications of the present invention can also be used. It is possible to use some aspects of the invention without using others. For example, it is possible to use a decoupling board for reducing lead lengths without providing vias for coupling conductive layers. Although illustrated embodiments show decoupling boards substantially sized and shaped to correspond to the BGA device footprint, decoupling boards can be smaller or larger than the BGA device and can, in some embodiments, cover or overlap only a portion of the BGA footprint. Although a decoupling board has been described in connection with PCBs which have BGA devices mounted thereon, it is also possible to use decoupling boards as described herein in connection with printed circuit boards which have modified or enhanced BGA devices or non-BGA devices positioned on or in the boards, including Flip Chip (FC) devices, High Density devices, Quad Flat Pack (QFP) devices overmolded BGA devices, SuperCSP™ devices, BCC devices, FBGA devices, EBGA devices, TAB-BGA devices, CCGA devices and others known to those of skill in the art. Although the decoupling boards are described as being solder ball-mounted, other mounting techniques can be used including adhesives, wirebonds and the like. In addition to providing layers for defining capacitors or providing capacitance, in some embodiments a small circuit board 412 can provide other functions (in place of or in addition to capacitance or decoupling) such as by using buried resistance and/or capacitance layers and discrete components, placement connectors, e.g. for bus breakout, direct placement of power converters, e.g. for core IC power, etc. Embodiments of the present invention can be configured to accommodate termination resistors or resistances, including providing for buried resistance. If desired, the integration of buried capacitance and/or buried resistance can be included into the packaging of integrated circuits. In general it is believe the use of micro vias 742 (FIG. 7B), buried vias 744 and/or blind vias 746 in the construction of apparatus according to embodiments of the present invention can assist in reducing electrical parasitics. The reduction through board vias would, in general, increase capacitance available for decoupling. Embodiments of the present invention can be used for the breakout of the internal pins of the device on the top side of the board. This would allow for reduction in the number of layers required to build the board and further lower cost.

The present invention, in various embodiments, includes components, methods, processes, systems and/or apparatus substantially as depicted and described herein, including various embodiments, subcombinations, and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g. for improving performance, achieving ease and/or reducing cost of implementation. The present invention includes items which are novel, and terminology adapted from previous and/or analogous technologies, for convenience in describing novel items or processes, do not necessarily retain all aspects of conventional usage of such terminology.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g. as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. Electronic apparatus comprising:
   a main circuit both having first and second major surfaces;
   at least a first ball grid array (BGA) integrated circuit package coupled to said first major surface of said main circuit board and defining a first footprint area on said first major surface and a second footprint area, substantially aligned with said first footprint area, on said second major surface, said BGA package having at least a first power supply pin;
   a decoupling board coupled to said second major surface of said main circuit board at least partially overlapping said second footprint area, said decoupling board having, as at least a portion of said board, at least a first plurality of conductive layers spaced apart by dielectric layers, said first plurality of conductive layers being electrically coupled together to define a first multilayer capacitor configured to accommodate an amount of decoupling capacitance, said decoupling board being solder-ball mounted to said second major surface of said main circuit board; and
   a first conductive pathway between said first multilayer capacitor and said first power supply pin, said conductive pathway having a first length.

2. Apparatus, as claimed in claim 1, wherein said first power supply pin is spaced a first distance from a closest edge of said first footprint area and wherein said first length is less than said first distance.

3. Apparatus, as claimed in claim 1;
   wherein said decoupling board has, as at least a portion of said board a second plurality of conductive layers spaced apart by dielectric layers, said second plurality of conductive layers being electrically coupled together to define a second multilayer capacitor; and
   wherein said first power supply pin comprises a power pin; and further comprising
   a ground pin in said BGA package; and
   a second conductive pathway between said second multilayer capacitor and said ground pin.

4. Apparatus as claimed in claim 1 wherein said dielectric has a dielectric constant of at least about 4.

5. Apparatus, as claimed in claim 1, further comprising at least a first discrete electronic component surface-mounted on said decoupler board.

6. Apparatus, as claimed in claim 1, wherein said first conductive pathway comprises a via formed in said decoupling board.

7. Apparatus, as claimed in claim 1, wherein said first conductive pathway comprises a first edge plating region of said decoupling board.

8. A method for decoupling a power supply pin of a ball grid array (BGA) integrated circuit package comprising:
   providing a main circuit board having first and second major surfaces;
   coupling said BGA package to said first major surface of said main circuit board, defining a first footprint area on said first major surface and a second footprint area, substantially aligned with said first footprint area, on said second major surface;
   mounting a decoupling board to said second major surface of said main circuit board at least partially overlapping said second major surface, said decoupling board having, as at least a portion of said board, at least a first plurality of conductive layers spaced apart by dielectric layers said mounting including solder-ball mounting said decoupling board;
   electrically coupling said first plurality of conductive layers together to define a first multilayer capacitor configured to accommodate an amount of decoupling capacitance; and
   forming a first conductive pathway between said first multilayer capacitor and said first power supply pin, said conductive pathway having a first length.

9. A method, as claimed in claim 8, wherein said first power supply pin is spaced a first distance from a closest edge of said first footprint area and wherein said first length is less than said first distance.

10. A method, as claimed in claim 8 wherein said decoupling board has, as at least a portion of said board a second plurality of conductive layers spaced apart by dielectric layers, said second plurality of conductive layers being electrically coupled together to define a second multilayer capacitor, and wherein said first power supply pin comprises a power pin and wherein said BGA package also includes a ground pin, the method further comprising
   forming a second conductive pathway between said second multilayer capacitor and said ground pin.

11. A method as claimed in claim 8 wherein said dielectric has a dielectric constant of at least about 4.

12. A method, as claimed in claim 8, further comprising surface-mounting at least a first discrete electronic component on said decoupling board.

13. A method, as claimed in claim 8, wherein said forming said first conductive pathway comprises forming a via in said decoupling board.

14. A method, as claimed in claim 8, wherein said step of forming said first conductive pathway comprises at least partially plating a first edge region of said decoupling board.

15. Apparatus for decoupling a power supply pin of a ball grid array (BGA) integrated circuit package comprising:
   a main circuit board having first and second major surfaces;
   means for coupling said BGA package to said first major surface of said main circuit board, defining a first footprint area on said first major surface and a second footprint area, substantially aligned with said first footprint area, on said second major surface;

decoupling means configured to accommodate an amount of decoupling capacitance, mounted to said second major surface of said main circuit board at least partially overlapping said second major surface, said decoupling means having, as at least a portion of said decoupling means, at least a first plurality of conductive layers spaced apart by dielectric layers;

solder-ball means for mounting said decoupling means to said second major surface;

means for electrically coupling said first plurality of conductive layers together to define a first multilayer capacitor; and first conductive pathway means between said first multilayer capacitor and said first power supply pin, said conductive pathway having a first length.

16. Apparatus, as claimed in claim 15, wherein said first power supply pin is spaced a first distance from a closest edge of said first footprint area and wherein said first length is less than said first distance.

17. Apparatus, as claimed in claim 15 wherein said decoupling means has, as at least a portion of said decoupling means, a second plurality of conductive layers spaced apart by dielectric layers, said second plurality of conductive layers being electrically coupled together to define a second multilayer capacitor, and wherein said first power supply pin comprises a power pin and wherein said BGA package also includes a ground pin, the apparatus further comprising second conductive pathway means between said second multilayer capacitor and said ground pin.

18. Apparatus as claimed in claim 15 wherein said dielectric has a dielectric constant of at least about 4.

19. Apparatus as claimed in claim 15, further comprising at least a first discrete electronic means surface-mounted on said decoupling means.

20. Apparatus as claimed in claim 15, wherein said first conductive pathway means comprises via means in said decoupling means.

21. Apparatus as claimed in claim 15, wherein said first conductive pathway means comprises plating means on a first edge region of said decoupling means.

* * * * *